US006991973B2

(12) United States Patent
Chang et al.

(10) Patent No.: US 6,991,973 B2
(45) Date of Patent: Jan. 31, 2006

(54) MANUFACTURING METHOD OF THIN FILM TRANSISTOR

(75) Inventors: Kow Ming Chang, Taipei (TW); Yuan Hung Chung, Taipei (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 10/913,584

(22) Filed: Aug. 5, 2004

(65) Prior Publication Data

US 2005/0009253 A1 Jan. 13, 2005

Related U.S. Application Data

(63) Continuation-in-part of application No. 10/259,137, filed on Sep. 26, 2002, now abandoned.

(51) Int. Cl.
*H01L 21/84* (2006.01)

(52) U.S. Cl. ...................... 438/149; 438/151; 438/304; 438/596

(58) Field of Classification Search ........ 438/149–166, 438/304, 596
See application file for complete search history.

(56) References Cited

U.S. PATENT DOCUMENTS

| | | | |
|---|---|---|---|
| 4,426,407 A | 1/1984 | Morin et al. | 427/86 |
| 4,700,461 A | 10/1987 | Choi et al. | 437/41 |
| 5,091,763 A | 2/1992 | Sanchez | 357/23.9 |
| 5,290,720 A * | 3/1994 | Chen | 438/304 |
| 5,358,879 A | 10/1994 | Brady et al. | 437/44 |
| 5,498,555 A | 3/1996 | Lin | 437/35 |
| 5,599,726 A | 2/1997 | Pan | 437/41 |
| 5,620,914 A | 4/1997 | Hikida et al. | 438/304 |
| 5,693,549 A | 12/1997 | Kim | 437/41 |
| 5,811,283 A | 9/1998 | Sun | 438/244 |
| 5,877,058 A | 3/1999 | Gardner et al. | 438/304 |
| 6,064,090 A | 5/2000 | Miyamoto et al. | 257/347 |
| 6,107,130 A | 8/2000 | Fulford, Jr. et al. | 438/231 |
| 6,399,451 B1 | 6/2002 | Lim et al. | 438/303 |
| 2003/0211697 A1 * | 11/2003 | Hsu et al. | 438/305 |

FOREIGN PATENT DOCUMENTS

KR 2001 036727 A 5/2001

* cited by examiner

*Primary Examiner*—Jennifer Kennedy
(74) *Attorney, Agent, or Firm*—Haverstock & Owens LLP

(57) ABSTRACT

A method of manufacturing a thin film transistor for solving the drawbacks of the prior arts is disclosed. The method includes steps of providing an insulating substrate, sequentially forming a source/drain layer, a primary gate insulating layer, and a first conducting layer on the insulating substrate, etching the first conducting layer to form a primary gate; sequentially forming a secondary gate insulating layer and a second conducting layer on the primary gate; and etching the second conducting layer to form a first secondary gate and a second secondary gate.

12 Claims, 7 Drawing Sheets

MANUFACTURING METHOD OF THIN FILM TRANSISTOR

FIELD OF THE INVENTION

The present invention is a CIP application of the parent application "Structure of Thin Film Transistor and Manufacturing Method thereof" bearing on the Ser. No. 10/259,137 and filed on Sep. 26, 2002 now abandoned. The present invention relates to a manufacturing method of a thin film transistor, and more particularly to a manufacturing method of a thin film transistor applied to TFT-LCD.

BACKGROUND OF THE INVENTION

Thin film transistor liquid crystal Display (TFT-LCD) has become one of the most popular and modern information goods. As result of being light, small and portable, having a lower operating voltage, being free of harmful radiation and suited to production on large scale, TFT-LCD substitutes for cathode ray tube display as a caressed computer display device.

In accordance with the structure of TFT-LCD, Drain of TFT has a higher electric field while TFT is operating, and there should be an off-state leakage current resulted while the device is shut down, thereby the application of TFT-LCD being limited.

Presently, someone provides a lightly doped drain structure and a field induced drain structure for preventing TFT-LCD from the off-state leakage current. FIG. 1 illustrates a lightly doped drain structure of the prior art for solving the problem of the off-state leakage current. The structure includes an insulating substrate 11, a source/drain layer 12, a gate insulating layer 13 and a gate layer 14, wherein the source/drain layer 12 further includes a drain 121, a lightly doped drain 1211, a channel 122, a source 123 and a lightly doped source 1231. The electric field of the drain 121 is reduced by means of adding lightly doped regions (i.e. the lightly doped drain 1211 and the lightly doped source 1231) corresponding to the original source 123 and the original drain 121 respectively near the channel 122, so as to prevent from the leakage current. However the TFT-LCD with the lightly doped regions is complex and hard to manufacture. Furthermore the resistance will increases because of the lightly doped degree. As result of the series resistance of the drain 121 and the source 123 increasing, the operating speed of the device reduces and the power dissipation increases.

Moreover, another improving structure of field-induction drain has been disclosed. However it has to add an extra photolithographic process for manufacturing the improving structure. The more photolithographic processes are introduced, the more mis-alignment and infected defects are resulted. Therefore, the cost and the manufacturing time of the improving structure must increase and the yield reduces.

Kim proposed a method of fabricating a thin film transistor (U.S. Pat. No. 5,693,549). In which, relatively complex procedures are disclosed. Firstly, a cap insulation film is formed on the first polysilicon film and a gate is formed by successively photoetching the cap insulation film, the first polysilicon film, and the first gate insulation film in the first method proposed by Kim. Secondly, a cap insulation film is formed on the second polysilicion film and a gate is formed by successively photoetching the cap insulation film, the second polysilicon film, and the first gate insulation film in the second method proposed by Kim. In the present invention, a relatively simpler manufacturing method of thin film transistor is proposed. In which, a gate is formed excluding the steps of: forming the cap insulation film; etching the cap insulating insulation film etc. Besides, the first and the second insulating layers 23 and 25 are formed sequentially thus the first and the second secondary gate insulating layers 251 and 252 are formed right on top of the first insulating layer 23 and the channel 222, and beneath the first and the second secondary gates 271 and 272 as shown in FIG. 2(*d*) of the present invention. Therefore, the thickness of the insulating layers between the first and second secondary gates 271 and 272 and the channel 222 (23+25) are relatively twice the thickness of a single insulating layer (23/25). Thus, the off-state leakage current of a thin film transistor would be relatively lower due to the relatively thicker gate insulating layer between the secondary gates (271 and 272) and the channel (222). However, there is no such a thicker gate insulating layer proposed in the '549 Patent since there is only a second gate insulating film (25/35) between the supplementary gates (26-1 and 26-2/36-1 and 36-2) and the channel (21-2 and 21-3/31-1 and 31-2) as shown in FIGS. 3 and 5 of the '549 Patent. Lastly, the secondary gate insulating layers layer 25 is formed around the primary gate 24 and has the effects of the cap insulation film of the '549 Patent thus there is no need of growing a cap insulating film in the present invention. From the above-mentioned descriptions and analyses, one could draw a conclusion that the '549 Patent did not anticipate the present invention. Furthermore, the manufacturing costs relate to the present invention would be relatively lower than those of the '549 Patent due to the relatively simpler manufacturing method.

Hikida et al. proposed a manufacturing method of a semiconductor device (U.S. Pat. No. 5,620,914) and Choi et al. disclosed a method of forming a junction field-effect transistor (U.S. Pat. No. 4,700,461). The proposed method in the '914 Patent is for manufacturing a semiconductor device having a lightly doped drain (LDD) structure. Thus, the purposes of these two cited references are different from that of the present invention (a manufacturing method of thin film transistor) firstly. In the '914 Patent, two implanting procedures (of impurity) are included and a source and drain region is formed at the last step to form the LDD structure, but in the present invention, only one implanting procedure (of impurity) is included and a source/drain layer is formed at the second step to form the thin film transistor secondly. In the '461 Patent, the proposed method of forming a junction field-effect transistor includes the step of: forming two closely spaced regions of opposite conductivity in the doped island of silicon (pSi 18) which is employed to form two n+ regions (22) to be operated with the n++ regions of source (36) and drain (34) to form a structure (as described in claim 1 and as shown in FIG. 1 of '461 Patent) similar to the aforementioned structure including a lightly doped drain 1211, a channel 122, a source 123 and a lightly doped source 1231 in the prior art, and the manufacturing method of the thin film transistor proposed in the present invention includes a relatively simpler method (with a relative simpler structure) having a step of forming a source/drain layer (which includes a source, a drain, and a channel regions) but excluding such steps of: forming the lightly doped drain and the lightly doped source instead. Thus, the present invention could not be disclosed, taught, and suggested by the '914 Patent in view of the '461 Patent. By the same token, the manufacturing costs relate to the present invention would be relatively lower than those of the '914/'461 Patents due to the relatively simpler manufacturing method.

Hence, the present invention is attempted to overcome the drawbacks of the prior arts and provides a manufacturing method of a thin film transistor for preventing TFT-LCD from the leakage current.

SUMMARY OF THE INVENTION

It is one object of the present invention to provide a manufacturing method of a thin film transistor applied to TFT-LCD.

It is another object of the present invention to provide a manufacturing method of a thin film transistor for preventing TFT-LCD from the leakage current.

According to the present invention, the method for manufacturing a thin film transistor, includes steps of providing an insulating substrate, sequentially forming a source/drain layer, a primary gate insulating layer, and a first conducting layer on the insulating substrate, etching the first conducting layer to form a primary gate, sequentially forming a secondary gate insulating layer and a second conducting layer on the primary gate, and etching the second conducting layer to form a first secondary gate and a second secondary gate.

Certainly, the insulating substrate can be a glass.

Certainly, the source/drain layer can be a high-doping semiconductor layer.

Certainly, the high-doping semiconductor layer can be high-doping polycrystalline silicon.

Preferably, the source/drain layer includes a drain, a channel and a source.

Preferably, the channel has a length equal to a sum of a length of the primary gate, a width of the secondary insulating layer, a length of the first secondary gate and a length of the second secondary gate.

Certainly, the primary gate insulating layer can be one selected from a silicon nitride ($SiN_x$), a silicon oxide ($SiN_x$), a silicon oxide nitride ($SiO_xN_y$), a tantalum oxide ($TaO_x$), an aluminum oxide ($AlO_x$) and a mixture thereof.

Certainly, the first conducting layer can be one selected from chromium (Cr), molybdenum (Mo), tantalum (Ta), tantalum molybdenum (TaMo), tungsten molybdenum (WMo), aluminum (Al), aluminum silicon (AlSi), copper (Cu) and a mixture thereof.

Certainly, the step (c) can be executed by means of a reactive ion etching.

Certainly, the secondary gate insulating layer can be one selected from a silicon nitride ($SiN_x$), a silicon oxide ($SiN_x$), a silicon oxide nitride ($SiO_xN_y$), a tantalum oxide ($TaO_x$), an aluminum oxide ($AlO_x$) and a mixture thereof.

Certainly, the second conducting layer can be one selected from chromium (Cr), molybdenum (Mo), tantalum (Ta), tantalum molybdenum (TaMo), tungsten molybdenum (WMo), aluminum (Al), aluminum silicon (AlSi), copper (Cu) and a mixture thereof.

Certainly, the step (e) can be executed by means of a reactive ion etching.

Now the foregoing and other features and advantages of the present invention will be more clearly understood through the following descriptions with reference to the drawings, wherein:

DETAILED DESCRIPTION OF THE PREFERRED EMBODIMENT

Figure 1:
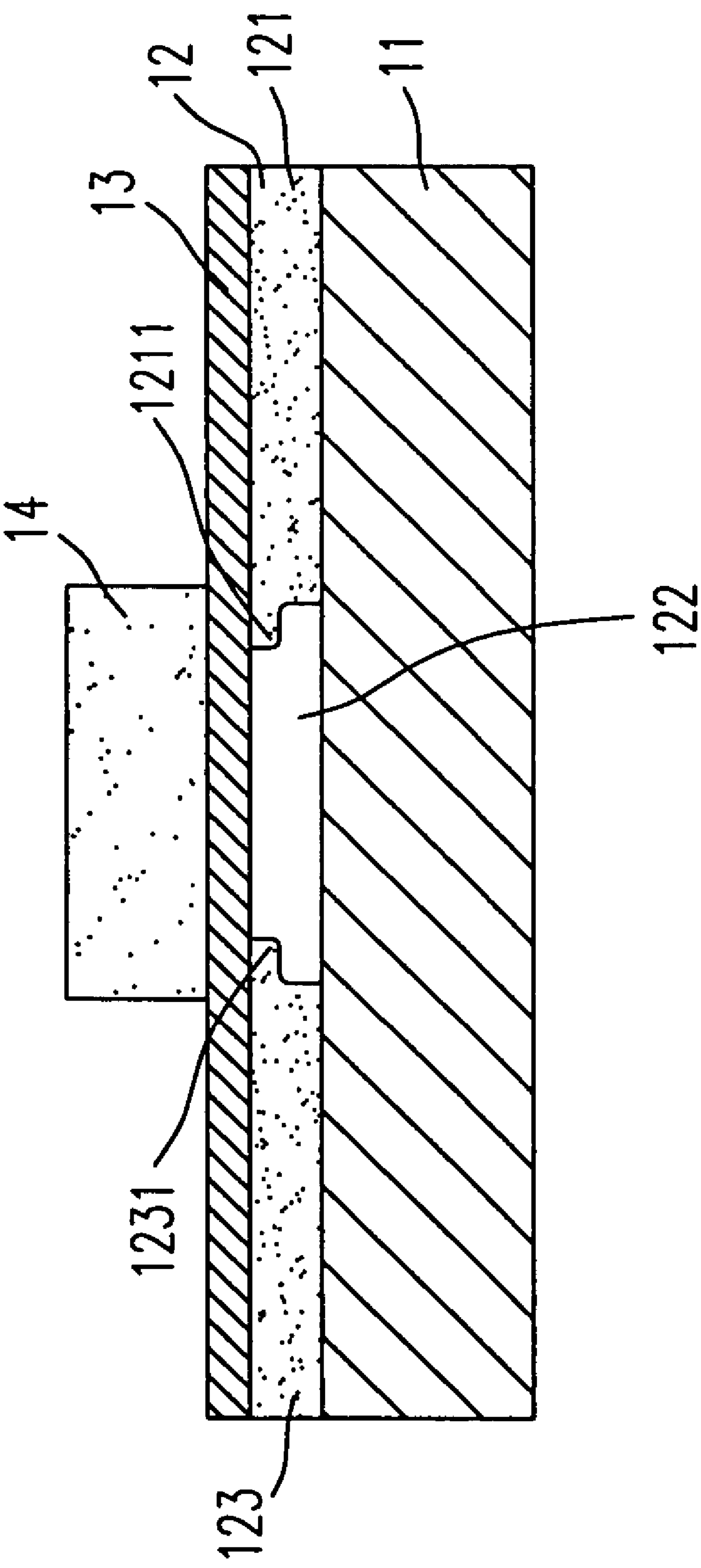
FIG. 1 illustrates a lightly doped drain structure of the prior art for solving the problem of the off-state leakage current.
Figure 2A:
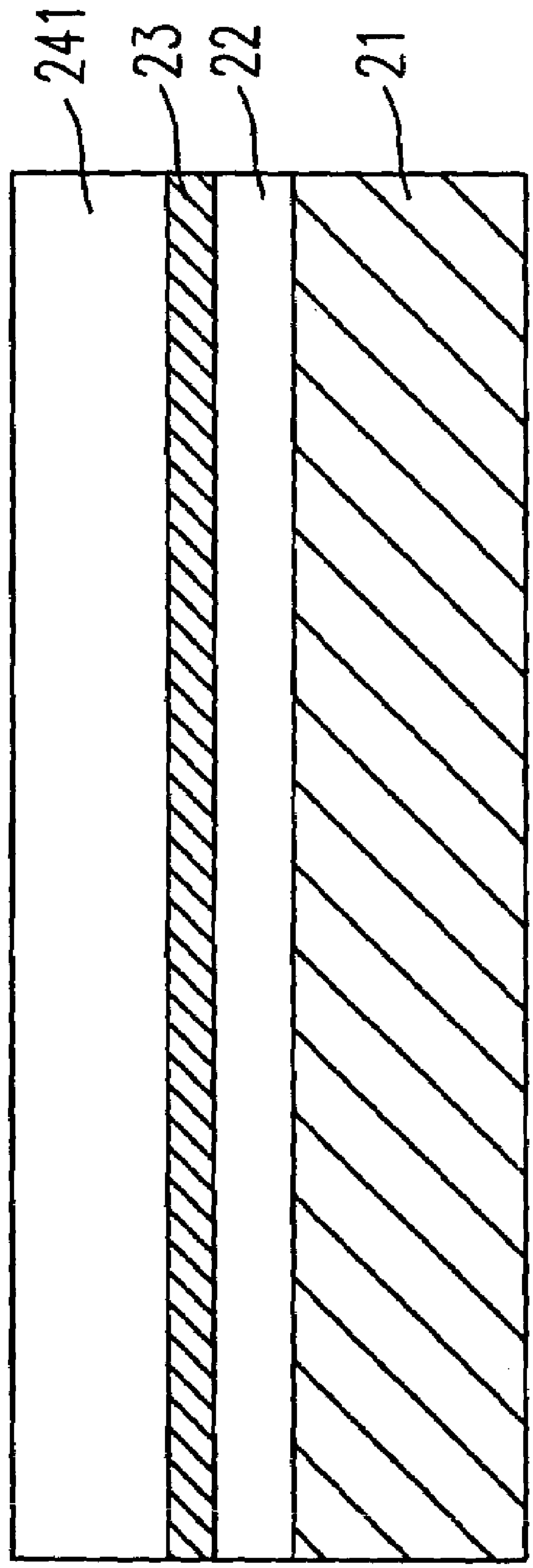
FIGS. 2(*a*)–2(*e*) illustrate the steps of manufacturing the thin film transistor according to the preferred embodiment of the present invention.
Figure 2:
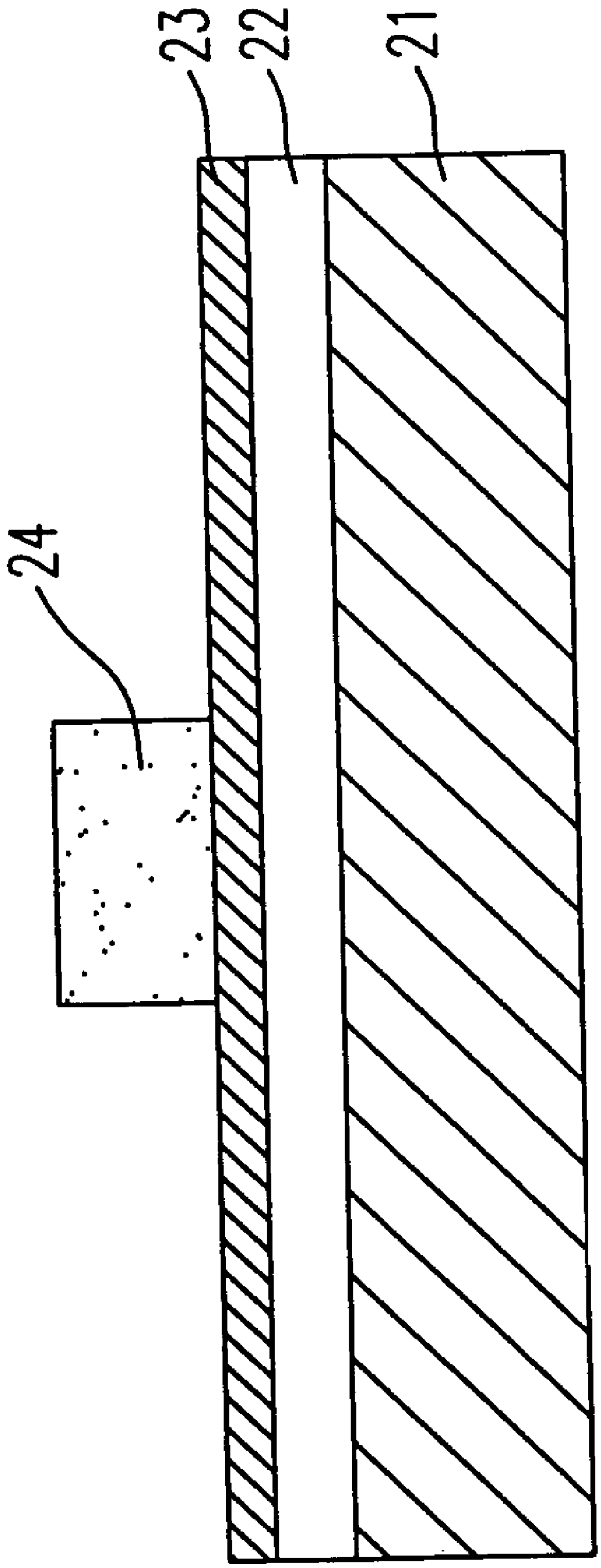
Figure 2C:
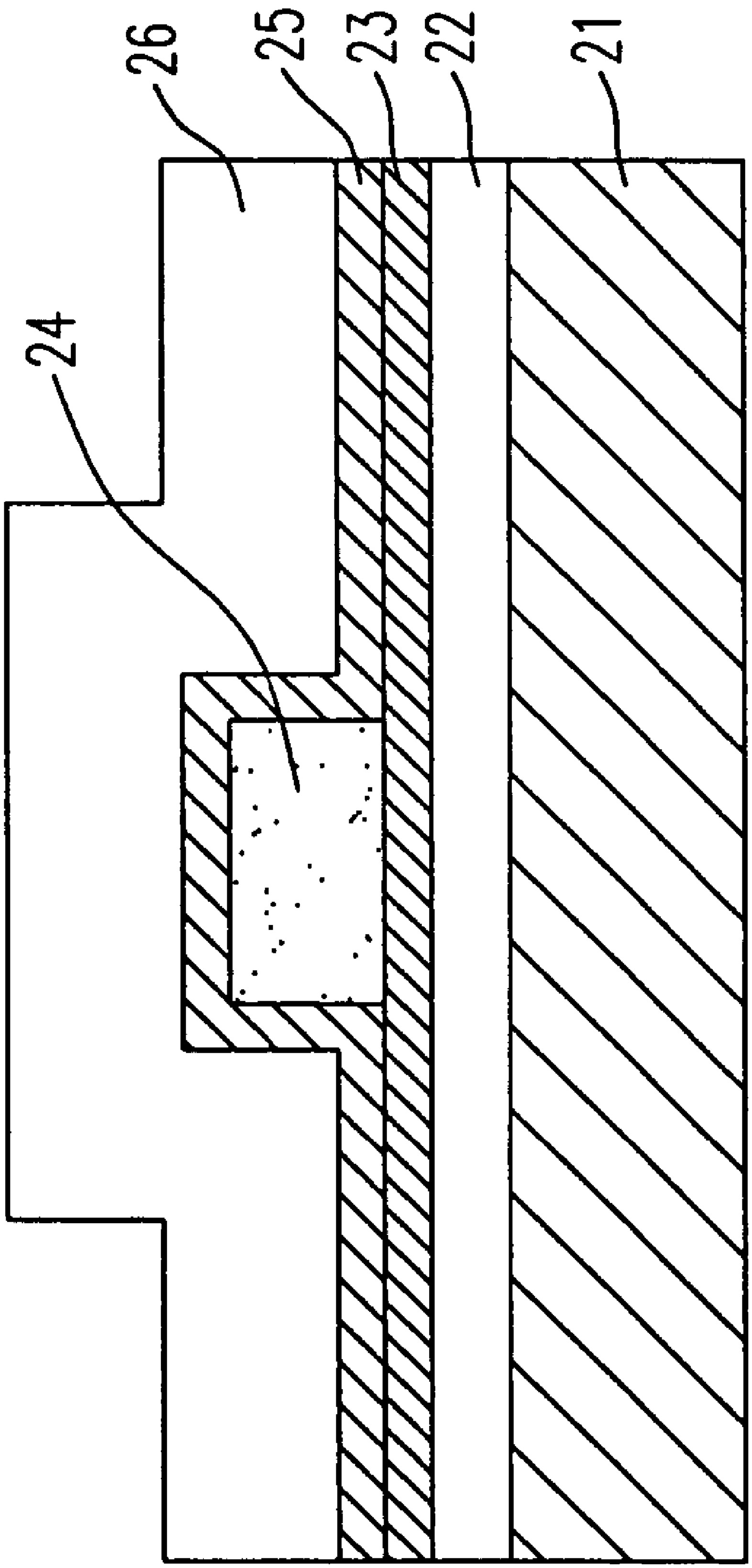
Figure 2:
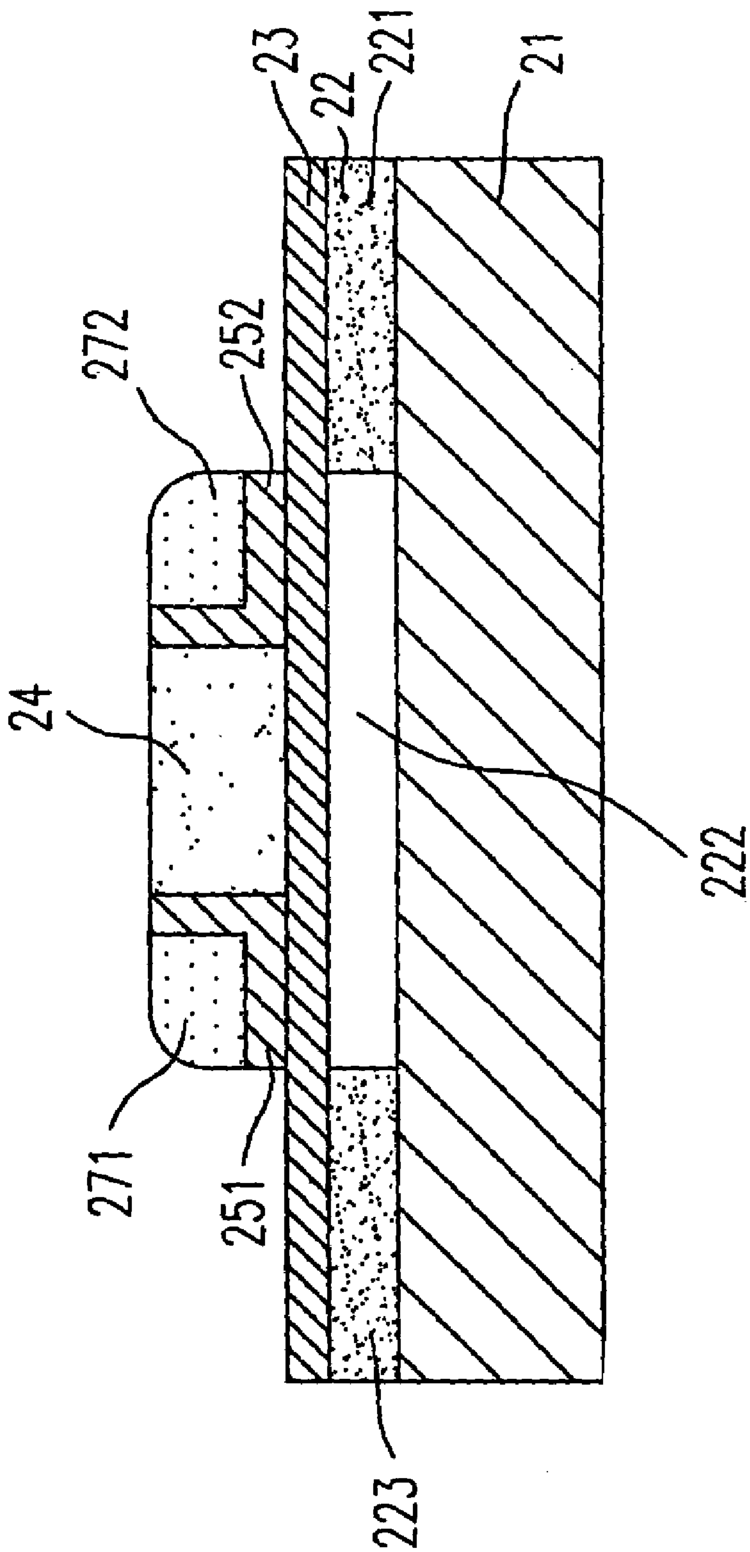
Figure 2:
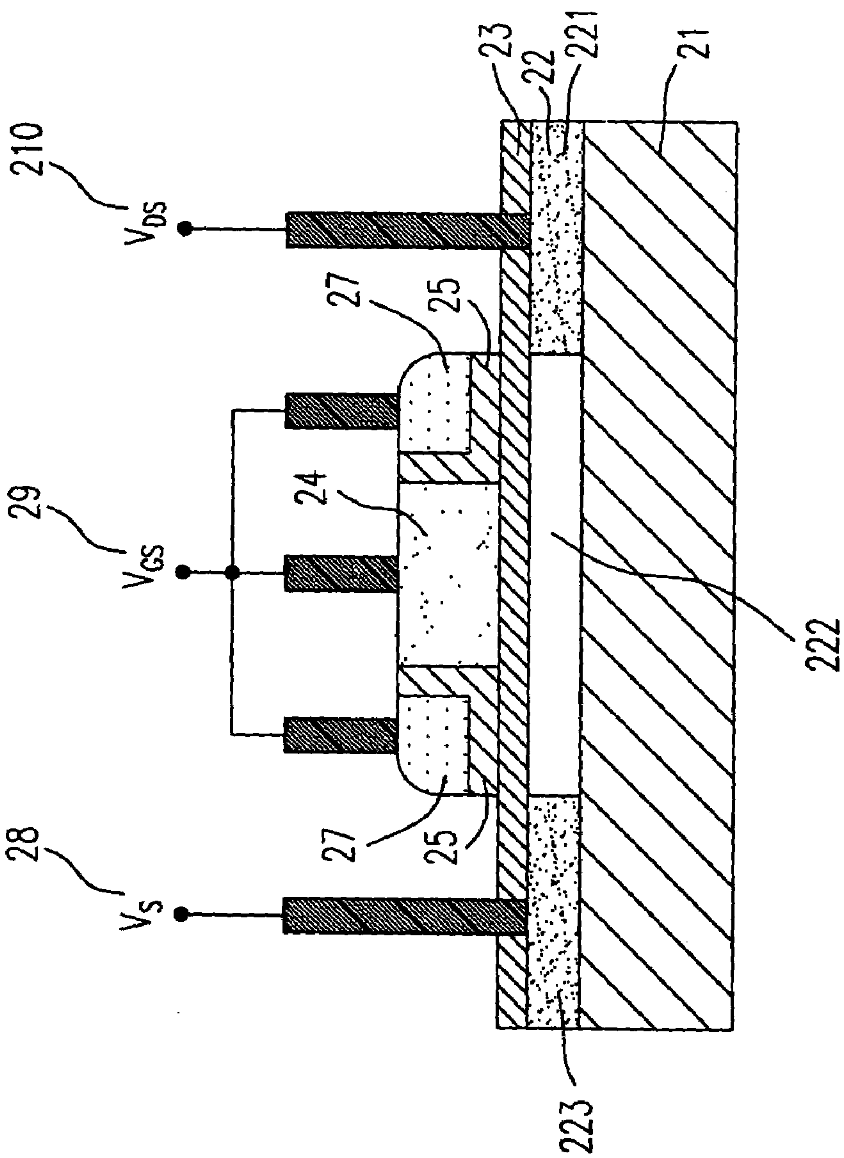

FIGS. 2(*a*)–2(*d*) illustrate the steps of manufacturing the thin film transistor according to the preferred embodiment of the present invention. The method for manufacturing a thin film transistor includes several steps. First, an insulating substrate 21 is provided and a source/drain layer 22, a primary gate insulating layer 23, and a first conducting layer 241 are sequentially formed on the insulating substrate 21, shown in FIG. 2(*a*). Secondly, the first conducting layer 241 is etched to form a primary gate 24, shown in FIG. 2(*b*). Thirdly, a secondary gate insulating layer 25 and a second conducting layer 26 are sequentially formed on the primary gate 24, shown in FIG. 2(*c*). Finally, the second conducting layer 26 and the secondary gate insulating layer 25 are etched to respectively form a first secondary gate 271 and a second secondary gate 272, and a first secondary gate insulating layer 251 and a second secondary gate insulating layer 252, shown in FIG. 2(*d*). As to FIG. 2(*e*), it illustrates the bias status of the thin film transistor including a source bias voltage (VS) 28, a gate/source bias voltage (VGS) 29 and a drain/source bias voltage (VDS) 210.

According to the above embodiment of the present invention, the insulating substrate 21 is a glass substrate, the source/drain layer 22 is a high-doping semiconductor layer, and the high-doping semiconductor layer is high-doping polycrystalline silicon. Furthermore, the source/drain layer 22 includes a drain 221, a channel 222 and a source 223. Meanwhile, the channel 222 has a length equal to a sum of a length of the primary gate 24, a width of the first secondary insulating layer 251 and the second secondary insulting layer 252, a length of the first secondary gate 271 and the second secondary gate 272.

As to the primary gate insulating layer 23 and the secondary gate insulating layer 25, they can be one selected from a silicon nitride ($SiN_x$), a silicon oxide ($SiN_x$), a silicon oxide nitride ($SiO_xN_y$), a tantalum oxide ($TaO_x$), an aluminum oxide ($AlO_x$) and a mixture thereof. However the first conducting layer 241 and the second conducting layer 26 are one selected from chromium (Cr), molybdenum (Mo), tantalum (Ta), tantalum molybdenum (TaMo), tungsten molybdenum (WMo), aluminum (Al), aluminum silicon (AlSi), copper (Cu) and a mixture thereof. Meanwhile, the first conducting layer 241, the second conducting layer 26 and the secondary gate insulating layer 25 are etched by means of a reactive ion etching.

Figure 3:
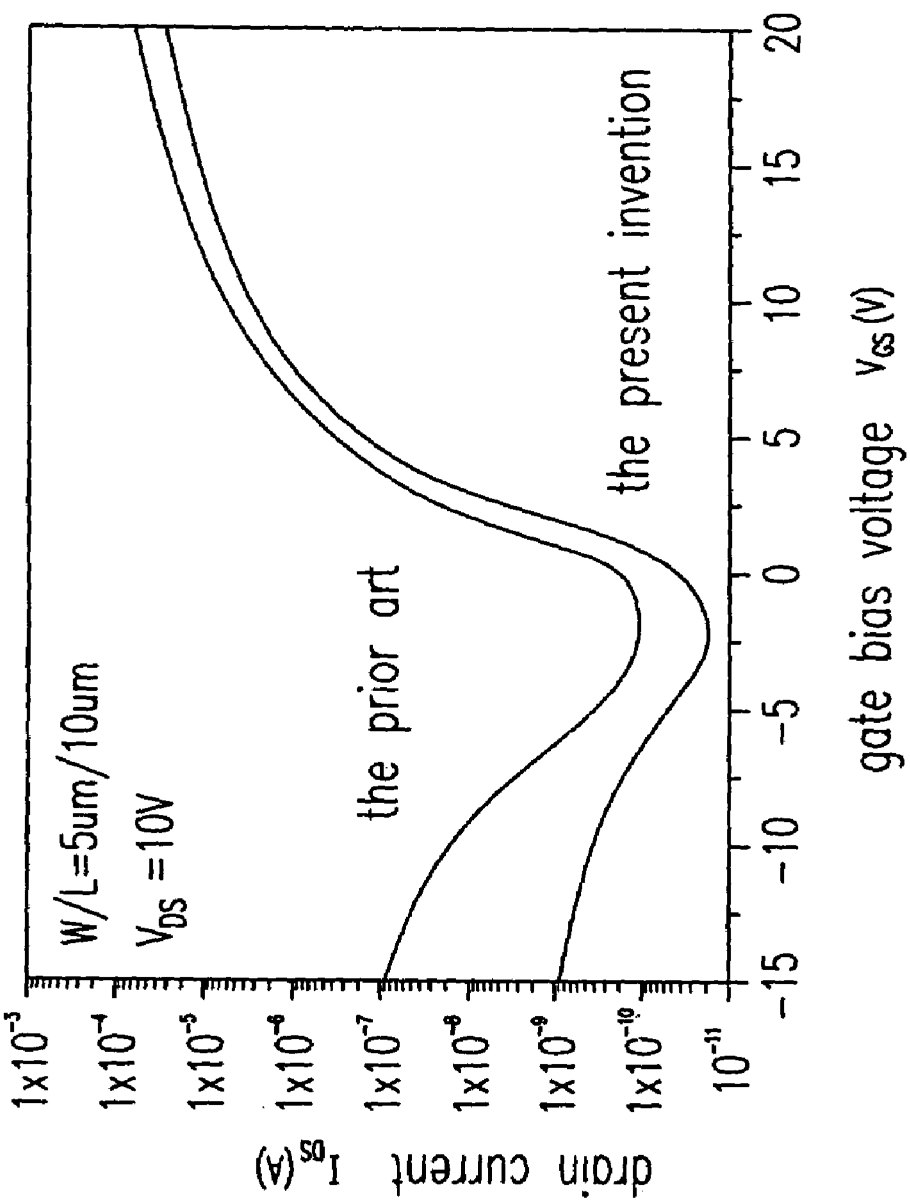
FIG. 3 illustrates electricity properties of the present invention compared with those of the prior art.

Referring to FIG. 3, it illustrates electricity properties of the present invention compared with those of the prior art. As result of operating the thin film transistor according to the bias status of FIG. 2(*e*), the thin film transistor of the present invention causes a lower leakage current. In FIG. 3, when the thin film transistor of the present invention and the thin film transistor of the prior art are operated in the same condition (VDS=10V), the leakage current caused by the present invention is lower than that caused by the prior art. While VDS=15V, the leakage current ($1\times10^{-9}$ A) of the present invention is 100 times as that ($1\times10^{-7}$A) of the prior art.

Accordingly, the present invention reduces the electric field of the drain region by means of providing a thicker gate insulating layer, so as to improve the problem of the high off-state leakage current of a thin film transistor. Comparing with the prior art, the present invention introduces four photolithographic processes equal to the traditional one, but doesn't have to add an extra photolithographic process. Therefore, the present invention can solve the drawbacks of the prior art and be practicability.

Although the present invention has been described and illustrated in detail, it is to be clearly understood that the same is by the way of illustration and example only and is not to be taken by way of limitation, the spirit and scope of the present invention being limited only by the terms of the appended claims.

What is claimed is:

1. A method for manufacturing a thin film transistor, comprising steps of:

(a) providing an insulating substrate;

(b) sequentially forming a source/drain layer, a primary gate insulating layer, and a first conducting layer on said insulating substrate;

(c) etching said first conducting layer to form a primary gate directly located on and contacting with a surface of said primary gate insulating layer, (d) forming a secondary gate insulating layer directly located on and horizontally contacting with said surface of said primary gate insulating layer and directly located on and contacting with a surface of said primary gate and a second conducting layer directly located on and contacting with a surface of said secondary gate insulating layer; and (e) etching said second conducting layer and said secondary gate insulating layer to form a first secondary gate and a second secondary gate both directly located on, contacting with, and located beside said surface of said secondary gate insulating layer.

2. The method according to claim 1, wherein said insulating substrate is glass.

3. The method according to claim 1, wherein said source/drain layer is a highly-doped semiconductor layer.

4. The method according to claim 3, wherein said highly-doped semiconductor layer is highly-doped polycrystalline silicon.

5. The method according to claim 1, wherein said source/drain layer comprises a drain, a channel and a source.

6. The method according to claim 5, wherein said channel has a length equal to a sum of a length of said primary gate, two times a width of said secondary insulating layer, a length of said first secondary gate and a length of said second secondary gate.

7. The method according to claim 1, wherein said primary gate insulating layer is one selected from a silicon nitride ($SiN_x$), a silicon oxide ($SiO_x$), a silicon oxide nitride ($SiO_xN_y$), a tantalum oxide ($TaO_x$), an aluminum oxide ($AlO_x$) and a mixture thereof.

8. The method according to claim 1, wherein said first conducting layer is one selected from chromium (Cr), molybdenum (Mo), tantalum (Ta), tantalum molybdenum (TaMo), tungsten molybdenum (WMo), aluminum (Al), aluminum silicon (AlSi), copper (Cu) and a mixture thereof.

9. The method according to claim 1, wherein said step (c) is executed by means of a reactive ion etching.

10. The method according to claim 1, wherein said secondary gate insulating layer is one selected from a silicon nitride ($SiN_x$), a silicon oxide ($SiO_x$), a silicon oxide nitride ($SiO_xN_y$), a tantalum oxide ($TaO_x$), an aluminum oxide ($AlO_x$) and a mixture thereof.

11. The method according to claim 1, wherein said second conducting layer is one selected from chromium (Cr), molybdenum (Mo), tantalum (Ta), tantalum molybdenum (TaMo), tungsten molybdenum (WMo), aluminum (Al), aluminum silicon (AlSi), copper (Cu) and a mixture thereof.

12. The method according to claim 1, wherein said step (e) is executed by means of a reactive ion etching.

* * * * *

UNITED STATES PATENT AND TRADEMARK OFFICE

CERTIFICATE OF CORRECTION

PATENT NO. : 6,991,973 B2
DATED : January 31, 2006
INVENTOR(S) : Kow Ming Chang and Yuan Hung Chung It is certified that error appears in the above-identified patent and that said Letters Patent is hereby corrected as shown below:

Column 2,
Line 23, replace “insulating layers layer 25” with -- insulating layer 25 --.

Signed and Sealed this

Eighteenth Day of April, 2006

JON W. DUDAS
*Director of the United States Patent and Trademark Office*